(12) United States Patent
Do et al.

(10) Patent No.: US 8,569,112 B2
(45) Date of Patent: Oct. 29, 2013

(54) INTEGRATED CIRCUIT PACKAGING SYSTEM WITH ENCAPSULATION AND LEADFRAME ETCHING AND METHOD OF MANUFACTURE THEREOF

(75) Inventors: Byung Tai Do, Singapore (SG); Arnel Senosa Trasporto, Singapore (SG); Linda Pei Ee Chua, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/425,277

(22) Filed: Mar. 20, 2012

(65) Prior Publication Data

US 2013/0249065 A1  Sep. 26, 2013

(51) Int. Cl.
*H01L 21/44* (2006.01)
*H01L 21/48* (2006.01)

(52) U.S. Cl.
USPC ........... 438/123; 438/121; 438/124; 438/127; 438/617; 257/E23.037; 257/E23.054

(58) Field of Classification Search
USPC .................. 438/123, 121, 124, 127, 617; 257/E23.037, E23.054
See application file for complete search history.

(56) References Cited

U.S. PATENT DOCUMENTS

| 5,976,912 | A  | * | 11/1999 | Fukutomi et al. | 438/110 |
|---|---|---|---|---|---|
| 6,238,952 | B1 |   | 5/2001  | Lin |  |
| 7,049,177 | B1 | * | 5/2006  | Fan et al. | 438/123 |
| 7,060,535 | B1 | * | 6/2006  | Sirinorakul et al. | 438/123 |
| 7,087,462 | B1 | * | 8/2006  | Park et al. | 438/112 |
| 7,344,920 | B1 | * | 3/2008  | Kirloskar et al. | 438/123 |
| 7,605,459 | B2 |   | 10/2009 | Mok et al. |  |
| 7,662,672 | B2 | * | 2/2010  | Lin | 438/123 |
| 7,836,586 | B2 | * | 11/2010 | Bayan et al. | 29/841 |
| 7,858,443 | B2 |   | 12/2010 | Powell et al. |  |
| 8,084,299 | B2 | * | 12/2011 | Tan et al. | 438/111 |
| 2002/0041022 | A1 | * | 4/2002 | Sakamoto et al. | 257/701 |
| 2004/0063252 | A1 | * | 4/2004 | Takahashi | 438/123 |
| 2008/0067649 | A1 | * | 3/2008 | Matsunaga et al. | 257/677 |
| 2008/0303134 | A1 | * | 12/2008 | Li et al. | 257/691 |
| 2010/0224971 | A1 | * | 9/2010 | Li | 257/676 |

* cited by examiner

*Primary Examiner* — Nitin Parekh
(74) *Attorney, Agent, or Firm* — Ishimaru & Associates LLP; I-Chang John Yang (57) ABSTRACT

A method of manufacture of an integrated circuit packaging system includes: providing a leadframe having a mounting region; applying a mounting structure in the mounting region; mounting an integrated circuit die on the mounting structure; forming an encapsulation on the integrated circuit die and having an encapsulation cavity, the encapsulation cavity shaped by the mounting structure; forming a lead having a lead protrusion from the leadframe, the lead protrusion below a horizontal plane of the integrated circuit die; and removing the mounting structure for exposing the integrated circuit die.

10 Claims, 5 Drawing Sheets

INTEGRATED CIRCUIT PACKAGING SYSTEM WITH ENCAPSULATION AND LEADFRAME ETCHING AND METHOD OF MANUFACTURE THEREOF

CROSS-REFERENCE TO RELATED APPLICATION(S)

The present application contains subject matter related to a concurrently filed U.S. patent application by Byung Tai Do, Arnel Senosa Trasporto and Linda Pei Ee Chua entitled "INTEGRATED CIRCUIT PACKAGING SYSTEM WITH TERMINALS AND METHOD OF MANUFACTURE THEREOF". The related application is assigned to STATS ChipPAC Ltd. and is identified by Ser. No. 13/424,968. The subject matter thereof is incorporated herein by reference thereto.

TECHNICAL FIELD

The present invention relates generally to an integrated circuit packaging system, and more particularly to a system with encapsulation and leadframe etching.

BACKGROUND ART

The integrated circuit package is the building block used in a high performance electronic system to provide applications for usage in products such as automotive vehicles, pocket personal computers, cell phone, intelligent portable military devices, aeronautical spacecraft payloads, and a vast line of other similar products that require small compact electronics supporting many complex functions.

A small product, such as a cell phone, can contain many integrated circuit packages, each having different sizes and shapes. Each of the integrated circuit packages within the cell phone can contain large amounts of complex circuitry. The circuitry within each of the integrated circuit packages work and communicate with other circuitry of other integrated circuit packages using electrical connections.

Products must compete in world markets and attract many consumers or buyers in order to be successful. It is very important for products to continue to improve in features, performance, and reliability while reducing product costs, product size, and to be available quickly for purchase by the consumers or buyers.

The amount of circuitry and the amount of electrical connections inside a product are key to improving the features, performance, and reliability of any product. Furthermore, the ways the circuitry and electrical connections are implemented can determine the packaging size, packaging methods, and the individual packaging designs. Attempts have failed to provide a complete solution addressing simplified manufacturing processing, smaller dimensions, lower costs due to design flexibility, increased functionality, leveragability, and increased IO connectivity capabilities.

Thus, a need still remains for an integrated circuit system improved yield, thermal cooling, low profile, and improved reliability. In view of the ever-increasing commercial competitive pressures, along with growing consumer expectations and the diminishing opportunities for meaningful product differentiation in the marketplace, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system, including: providing a leadframe having a mounting region; applying a mounting structure in the mounting region; mounting an integrated circuit die on the mounting structure; forming an encapsulation on the integrated circuit die and having an encapsulation cavity, the encapsulation cavity shaped by the mounting structure; forming a lead having a lead protrusion from the leadframe, the lead protrusion below a horizontal plane of the integrated circuit die; and removing the mounting structure for exposing the integrated circuit die.

The present invention provides an integrated circuit packaging system, including: an integrated circuit die; a lead having a lead protrusion, the lead protrusion below a horizontal plane of the integrated circuit die; and an encapsulation formed on the integrated circuit die and having an encapsulation cavity, the encapsulation cavity exposing the integrated circuit die from the encapsulation.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGURES. Similarly, although the views in the drawings for ease of description generally show similar orientations, this depiction in the FIGURES is arbitrary for the most part. Generally, the invention can be operated in any orientation.

The same numbers are used in all the drawing FIGURES to relate to the same elements. The embodiments have been numbered first embodiment, second embodiment, etc. as a matter of descriptive convenience and are not intended to have any other significance or provide limitations for the present invention.

The term "processing" as used herein includes deposition of material or photoresist, patterning, exposure, development, etching, cleaning, and/or removal of the material or photoresist as required in forming a described structure. The term "active side" refers to a side of a die, a module, a package, or an electronic structure having active circuitry fabricated thereon or having elements for connection to the active circuitry within the die, the module, the package, or the electronic structure.

For expository purposes, the term "horizontal" as used herein is defined as a plane parallel to the active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" is defined as meaning there is direct contact between elements or components with no intervening material.

Figure 1:
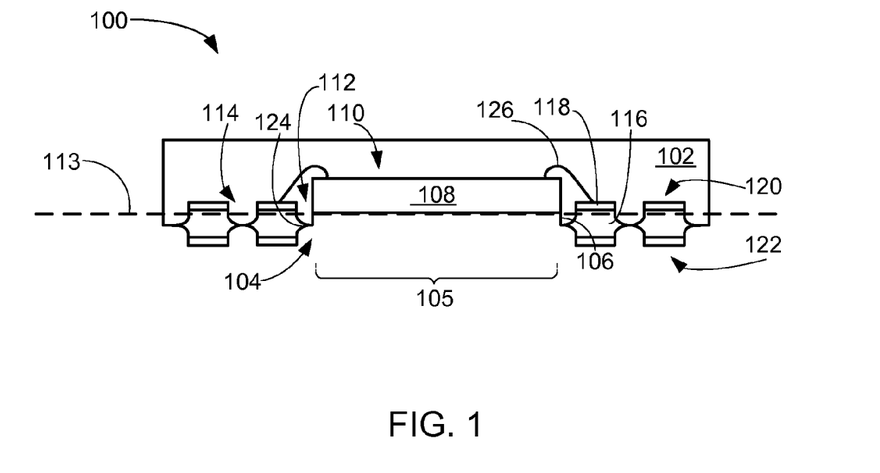
FIG. 1 is a cross-sectional view of the integrated circuit packaging system taken along line 1-1 of FIG. 2 in a first embodiment of the present invention.
Figure 2:
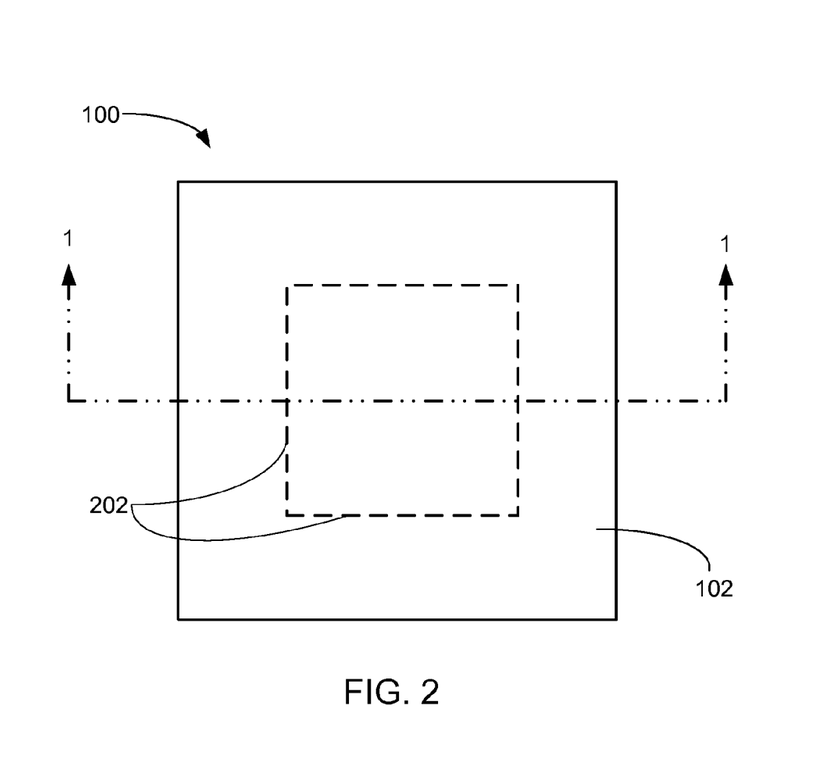
FIG. 2 is a top view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 is shown having an encapsulation 102, an integrated circuit die 108, and a lead 114.

The encapsulation 102 covers the integrated circuit die 108 and the lead 114 and provides mechanical protection, environmental protection, and a hermetic seal for the integrated circuit packaging system 100. The encapsulation 102 can be made from an epoxy molding compound (EMC), film assisted molding, polymide compound, or a wire-in-film (WIF), as examples.

The encapsulation 102 can include an encapsulation cavity 104. The encapsulation cavity 104 can expose the integrated circuit die 108 from the encapsulation 102. The encapsulation cavity 104 can have a cavity horizontal dimension 105, which is defined as the length and the width of the encapsulation cavity 104. The cavity horizontal dimension 105 can be equal to the length and the width of the integrated circuit die 108. For example, the encapsulation cavity 104 is shown having horizontal dimensions equal to the horizontal dimensions of the integrated circuit die 108.

The encapsulation cavity 104 can also have horizontal dimensions larger or smaller than the horizontal dimensions of the integrated circuit die 108. For example, the cavity horizontal dimension 105 can also be longer than the length of the integrated circuit die 108. The encapsulation cavity 104 can be bounded by a cavity sidewall 106 on a non-horizontal side of the encapsulation 102. The cavity sidewall 106 can be orthogonal and perpendicular to a top surface of the integrated circuit die 108 and can be coplanar with the non-horizontal sidewall of the integrated circuit die 108.

The integrated circuit die 108 is embedded in the encapsulation 102. The integrated circuit die 108 is shown as a wire-bonded chip as an example. The integrated circuit die 108 can have an active side 110 and have a non-active side 112 opposite the active side 110. The non-active side 112 of the integrated circuit die 108 is exposed from the encapsulation 102 at the encapsulation cavity 104. A horizontal plane 113 is coplanar with the non-active side 112 of the integrated circuit die 108.

The cavity sidewall 106 can have an uneven surface, bulging surface, or an irregular surface characteristic of being formed on a deformable mounting structure. The deformable mounting structure can include a compressed laminated tape, a film, or a thermal release material.

The encapsulation cavity 104 can have removal marks, chemical residue, uneven surfaces, micro recesses characteristic, or a combination thereof characteristic of a destructible removal process. The destructible removal process can include laser ablation and chemical etching.

The lead 114 can be formed in a number of rows surrounding and spaced from the integrated circuit die 108. As an example, a plurality of the lead 114 is shown in two rows surrounding the encapsulation cavity 104 and the integrated circuit die 108. The lead 114 can include a lead body 116 and a lead plating 118.

The lead body 116 provides the base structure of the lead 114 on which the lead plating 118 can be formed. The lead body 116 can be made from a variety of materials including copper, tin, zinc, other conductive metals, or metal alloy.

The lead plating 118 can be formed on the lead body 116 in a number of ways. For example, the lead plating 118 can be formed by a process such as sputtering, electroplating, or chemical vapor deposition (CVD). The lead plating 118 can be made from metals including gold, silver, nickel, other conductive metal, or a combination thereof as examples.

The lead 114 can include a lead top side 120 and a lead bottom side 122 opposite to the lead top side 120. The lead plating 118 can be formed at the lead top side 120 and the lead bottom side 122 of the lead body 116.

The lead body 116 can include a lead protrusion 124 on a non-horizontal side of the lead body 116. The lead protrusion 124 extends from the lead plating 118 at the lead top side 120 and extends from the lead plating 118 at the lead bottom side 122 to form a tip at the non-horizontal side of the lead body 116. The lead protrusion 124 at the lead bottom side 122 can extend to the encapsulation cavity 104. The lead protrusion 124 is below the horizontal plane 113 at the non-active side 112 of the integrated circuit die 108.

The lead protrusion 124 is shown extending to and exposed at the cavity sidewall 106 of the encapsulation cavity 104. The lead protrusion 124 can also have a portion of the encapsulation 102 between the lead protrusion 124 and the cavity sidewall 106 depending on the horizontal dimensions including the cavity horizontal dimension 105 of the encapsulation cavity 104.

The integrated circuit packaging system 100 can include a chip interconnect 126. The chip interconnect 126 provides an electrical connection and can include a bond wire, a solder ball, or a solder pillar as examples. The chip interconnect 126 can connect the lead plating 118 at the lead top side 120 to the active side 110 of the integrated circuit die 108. The chip interconnect 126 provides electrical connectivity from the lead 114 to the integrated circuit die 108.

It has been discovered that the exposure of the non-active side 112 from the encapsulation 102 provides airflow and cooling for the integrated circuit die 108. The encapsulation cavity 104 provides the non-active side 112 of the integrated circuit die 108 with exposure from the encapsulation 102. The integrated circuit packaging system 100 is thermally enhanced and the integrated circuit die 108 does not require a die paddle that can interfere with cooling.

Further, it has been discovered that the configuration of the lead protrusion 124 below the horizontal plane 113 of the non-active side 112 of the integrated circuit die 108 further increases airflow to the integrated circuit die 108. The placement of the integrated circuit die 108 in the encapsulation 102 also provides a variable height for the encapsulation cavity 104, which allows the integrated circuit die 108 to be spaced further from substrates and packages mounted to the lead 114 for increased air flow and cooling.

Referring now to FIG. 2, therein is shown a top view of the integrated circuit packaging system 100. The integrated circuit packaging system 100 is shown having the encapsulation 102. For illustrative purposes, dash lines show the outline of the integrated circuit die 108 of FIG. 1 under the encapsulation 102. The integrated circuit die 108 can include a die horizontal dimension 202, which is defined as the length and the width of the integrated circuit die 108.

Figure 3:
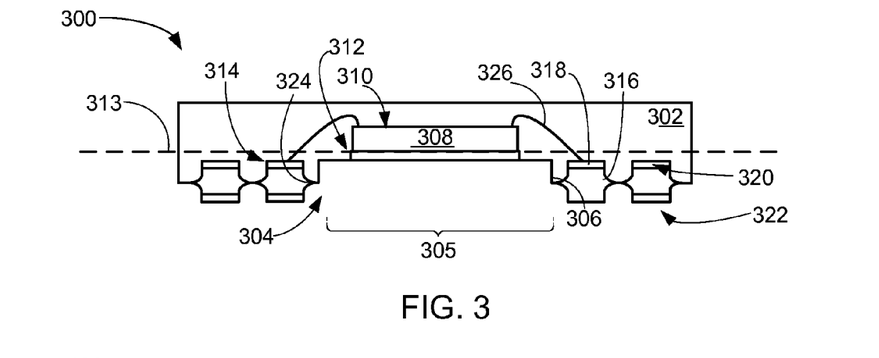
FIG. 3 is a cross-sectional view of an integrated circuit packaging system exemplified by the top view of FIG. 2 taken along line 1-1 of FIG. 2 in a second embodiment of the present invention.

Referring now to FIG. 3, therein is shown a cross-sectional view of an integrated circuit packaging system 300 exemplified by the top view of FIG. 2 taken along line 1-1 of FIG. 2 in a second embodiment of the present invention. The integrated circuit packaging system 300 is shown having an encapsulation 302, an integrated circuit die 308, and a lead 314.

The encapsulation 302 covers the integrated circuit die 308 and the lead 314 and provides mechanical protection, environmental protection, and a hermetic seal for the integrated circuit packaging system 300. The encapsulation 302 can include an epoxy molding compound (EMC), film assisted molding, polymide compound, or a wire-in-film (WIF), as examples.

The encapsulation 302 can include an encapsulation cavity 304. The encapsulation cavity 304 can expose the integrated circuit die 308 from the encapsulation 302. The encapsulation cavity 304 can have a cavity horizontal dimension 305, which is defined as the length and the width of the encapsulation cavity 304. The cavity horizontal dimension 305 can be larger than the die horizontal dimension 202 of FIG. 2 of the integrated circuit die 308. For example, the encapsulation cavity 304 can have the cavity horizontal dimension 305 greater than the die horizontal dimensions 202 of FIG. 2 for allowing a longer and wider die to fit into the encapsulation cavity 304.

The encapsulation cavity 304 can also have horizontal dimensions equal to or smaller than the horizontal dimensions of the integrated circuit die 308. The encapsulation cavity 304 can be bounded by a cavity sidewall 306 on a non-horizontal side of the encapsulation 302. The encapsulation cavity 304 can be bounded by the cavity sidewall 306 on a non-horizontal side of the encapsulation 302. The cavity sidewall 306 can be orthogonal and perpendicular to a top surface of the integrated circuit die 308 and can be coplanar with the non-horizontal sidewall of the integrated circuit die 308.

The integrated circuit die 308 is embedded in the encapsulation 302. The integrated circuit die 308 is shown as a wire-bonded chip as an example. The integrated circuit die 308 can have an active side 310 and have a non-active side 312 opposite the active side 310. The non-active side 312 of the integrated circuit die 308 is exposed from the encapsulation 302 at the encapsulation cavity 304. A horizontal plane 313 is coplanar with the non-active side 312 of the integrated circuit die 308.

The cavity sidewall 306 can have an uneven surface, bulging surface, or an irregular surface characteristic of being formed on a deformable mounting structure. The deformable mounting structure can include a compressed laminated tape, a film, or a thermal release material.

The encapsulation cavity 304 can have removal marks, chemical residue, uneven surfaces, micro recesses characteristic, or a combination thereof characteristic of a destructible removal process. The destructible removal process can include laser ablation and chemical etching.

The lead 314 can be formed in a number of rows surrounding and spaced from the integrated circuit die 308. As an example, a plurality of the lead 314 is shown in two rows surrounding the encapsulation cavity 304 and the integrated circuit die 308. The lead 314 can include a lead body 316 and a lead plating 318.

The lead body 316 provides the base structure of the lead 314 on which the lead plating 318 can be formed. The lead body 316 can be made from a variety of materials including copper, tin, zinc, other conductive metals, or metal alloy.

The lead plating 318 can be formed on the lead body 316 in a number of ways. For example, the lead plating 318 can be formed by a process such as sputtering, electroplating, or chemical vapor deposition (CVD). The lead plating 318 can be made from metals including gold, silver, nickel, other conductive metal, or a combination thereof as examples.

The lead 314 can include a lead top side 320 and a lead bottom side 322 opposite to the lead top side 320. The lead plating 318 can be formed at the lead top side 320 and the lead bottom side 322 of the lead body 316.

The lead body 316 can include a lead protrusion 324 on a non-horizontal side of the lead body 316. The lead protrusion 324 extends from the lead plating 318 at the lead top side 320 and extends from the lead plating 318 at the lead bottom side 322 to form a tip at the non-horizontal side of the lead body 316. The lead protrusion 324 at the lead bottom side 322 can extend to the encapsulation cavity 304. The lead protrusion 324 is below the horizontal plane 313 at the non-active side 312 of the integrated circuit die 308.

The lead protrusion 324 is shown extending to and exposed at the cavity sidewall 306 of the encapsulation cavity 304. The lead protrusion 324 can also have a portion of the encapsulation 302 between the lead protrusion 324 and the cavity sidewall 306 depending on the horizontal dimensions including the cavity horizontal dimension 305 of the encapsulation cavity 304.

The integrated circuit packaging system 300 can include a chip interconnect 326. The chip interconnect 326 provides an electrical connection and can include a bond wire, a solder ball, or a solder pillar as examples. The chip interconnect 326 can connect the lead plating 318 at the lead top side 320 to the active side 310 of the integrated circuit die 308. The chip interconnect 326 provides electrical connectivity from the lead 314 to the integrated circuit die 308.

It has been discovered that the exposure of the non-active side 312 from the encapsulation 302 provides airflow and cooling for the integrated circuit die 308. The encapsulation cavity 304 provides the non-active side 312 of the integrated circuit die 308 with exposure from the encapsulation 302. The integrated circuit packaging system 300 is thermally enhanced and the integrated circuit die 308 does not require a die paddle that can interfere with cooling.

Further, it has been discovered that the configuration of the lead protrusion 324 below the horizontal plane 313 of the non-active side 312 of the integrated circuit die 308 further increases airflow to the integrated circuit die 308. The placement of the integrated circuit die 308 in the encapsulation 302 also provides a variable height for the encapsulation cavity 304, which allows the integrated circuit die 308 to be spaced further from substrates and packages mounted to the lead 314 for increased air flow and cooling.

Figure 4:
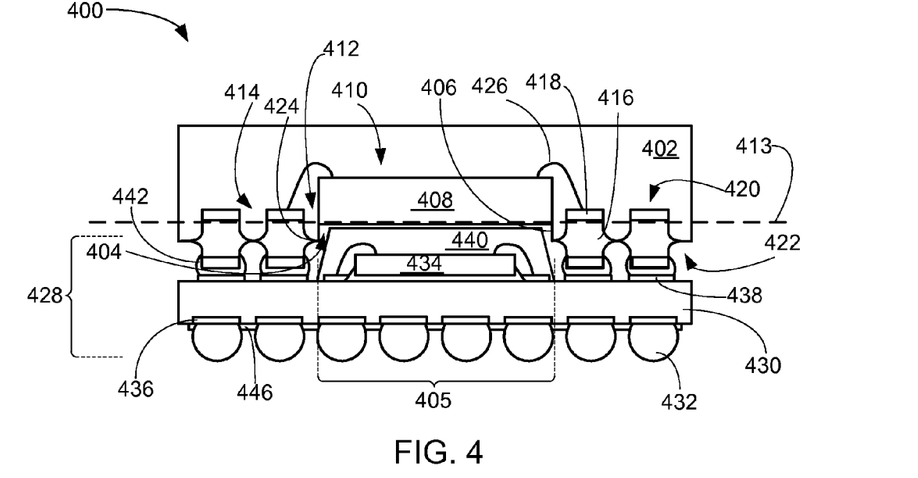
FIG. 4 is a cross-sectional view of the integrated circuit packaging system exemplified by the top view of FIG. 2 taken along line 1-1 of FIG. 2 in a third embodiment of the present invention.

Referring now to FIG. 4, therein is shown a cross-sectional view of an integrated circuit packaging system 400 exemplified by the top view of FIG. 2 taken along line 1-1 of FIG. 2 in a third embodiment of the present invention. The integrated circuit packaging system 400 can be similar to the integrated circuit packaging system 100 of FIG. 1 except for an additional base package forming a package-on-package system.

The integrated circuit packaging system 400 is shown having an encapsulation 402, an integrated circuit die 408, and a lead 414. The encapsulation 402 can include an encapsulation cavity 404 and can provide mechanical protection, environmental protection, and a hermetic seal for the integrated circuit packaging system 400. The encapsulation cavity 404 can expose the integrated circuit die 408 from the encapsulation 402.

The encapsulation cavity 404 can have a cavity horizontal dimension 405, which is defined as the length and the width of the encapsulation cavity 404. The cavity horizontal dimension 405 can be equal to the die horizontal dimension 202 of FIG. 2 of the integrated circuit die 408. For example, the encapsulation cavity 404 can have the cavity horizontal dimension 405 equal to the die horizontal dimension 202 of FIG. 2.

The encapsulation cavity 404 can also have horizontal dimensions larger or smaller than the horizontal dimensions of the integrated circuit die 408. For example, the cavity horizontal dimension 405 can also be longer than the length of the integrated circuit die 408. The encapsulation cavity 404 can be bounded by a cavity sidewall 406 on a non-horizontal side of the encapsulation 402. The cavity sidewall 406 can be orthogonal and perpendicular to a top surface of the integrated circuit die 408 and can be coplanar with the non-horizontal sidewall of the integrated circuit die 408.

The integrated circuit die 408 is embedded in the encapsulation 402. The integrated circuit die 408 is shown as a wire-bonded chip as an example. The integrated circuit die 408 can have an active side 410 and have a non-active side 412 opposite the active side 410. The non-active side 412 of the integrated circuit die 408 is exposed from the encapsulation 402 at the encapsulation cavity 404. A horizontal plane 413 is coplanar with the non-active side 412 of the integrated circuit die 408.

The cavity sidewall 406 can have an uneven surface, bulging surface, or an irregular surface characteristic of being formed on a deformable mounting structure. The deformable mounting structure can include a compressed laminated tape, a film, or a thermal release material.

The encapsulation cavity 404 can have removal marks, chemical residue, uneven surfaces, micro recesses characteristic, or a combination thereof characteristic of a destructible removal process. The destructible removal process can include laser ablation and chemical etching.

The lead 414 can be formed in a number of rows surrounding and spaced from the integrated circuit die 408. As an example, a plurality of the lead 414 is shown in two rows surrounding the encapsulation cavity 404 and the integrated circuit die 408. The lead 414 can include a lead body 416 and a lead plating 418.

The lead body 416 provides the base structure of the lead 414 on which the lead plating 418 can be formed. The lead body 416 can be made from a variety of materials including copper, tin, zinc, other conductive metals, or metal alloy.

The lead plating 418 can be formed on the lead body 416 in a number of ways. For example, the lead plating 418 can be formed by a process such as sputtering, electroplating, or chemical vapor deposition (CVD). The lead plating 418 can be made from metals including gold, silver, nickel, other conductive metal, or a combination thereof as examples.

The lead 414 can include a lead top side 420 and a lead bottom side 422 opposite to the lead top side 420. The lead plating 418 can be formed at the lead top side 420 and the lead bottom side 422 of the lead body 416.

The lead body 416 can include a lead protrusion 424 on a non-horizontal side of the lead body 416. The lead protrusion 424 extends from the lead plating 418 at the lead top side 420 and extends from the lead plating 418 at the lead bottom side 422 to form a tip at the non-horizontal side of the lead body 416. The lead protrusion 424 at the lead bottom side 422 can extend to the encapsulation cavity 404. The lead protrusion 424 is below the horizontal plane 413 at the non-active side 412 of the integrated circuit die 408.

The lead protrusion 424 is shown extending to and exposed at the cavity sidewall 406 of the encapsulation cavity 404. The lead protrusion 424 can also have a portion of the encapsulation 402 between the lead protrusion 424 and the cavity sidewall 406 depending on the horizontal dimensions including the cavity horizontal dimension 405 of the encapsulation cavity 404.

The integrated circuit packaging system 400 can include a chip interconnect 426. The chip interconnect 426 provides an electrical connection and can include a bond wire, a solder ball, or a solder pillar as examples. The chip interconnect 426 can connect the lead plating 418 at the lead top side 420 to the active side 410 of the integrated circuit die 408. The chip interconnect 426 provides electrical connectivity from the lead 414 to the integrated circuit die 408.

The lead plating 418 at the lead bottom side 422 can be mounted to a base package 428. The base package 428 can include a base substrate 430, a system interconnect 432, and a base integrated circuit die 434. The base package 428 can include a very fine-pitched ball grid array (VFBGA).

The base substrate 430 can provide structural support and connectivity for other components and devices. The base substrate 430 can include a system contact pad 436 on a top surface of the base substrate 430. The base substrate 430 can include a mount contact pad 438 on a side of the base substrate 430 opposite to the system contact pad 436.

The base substrate 430 can include a solder mask 446 formed on the bottom surface of the base substrate 430. The solder mask 446 can include a polymer material, an epoxy material, or a dry film material as examples. The system contact pad 436 can be exposed from the solder mask 446.

The system interconnect 432 can be attached to the system contact pad 436 on the bottom surface of the base substrate 430 for attaching the base package 428 to the next level system (not shown). The system interconnect 432 can include solder balls, solder dots, solder pillars, or a conductive bump as examples.

A mount interconnect 442 can attach the lead 414 to the base substrate 430. The mount interconnect 442 provides a direct electrical and mechanical connection between the lead 414 and the base substrate 430. The mount interconnect 442 can include solder paste, solder dots, or a conductive bump.

The base integrated circuit die 434 can be mounted to the base substrate 430. The base integrated circuit die 434 is shown as a wire-bond chip although the base integrated circuit die 434 can also be a flip chip. The base integrated circuit die 434 can be mounted to the base substrate 430 with an adhesive layer. The base integrated circuit die 434 can be electrically connected to the base substrate 430 through interconnects such as bond wires.

A base encapsulation 440 can cover the base integrated circuit die 434. The base encapsulation 440 is shown only covering the base integrated circuit die 434 with the lead 414 not in contact with the base encapsulation 440 and a portion of the base substrate 430 exposed from the base encapsulation 440. The base encapsulation 440 is shown having a length and a width substantially equal to the length and width of the integrated circuit die 408. The top surface of the base encapsulation 440 can be positioned within the encapsulation cavity 404 with the integrated circuit die 408 suspended over the base encapsulation 440.

The base encapsulation 440 is shown having sloped sidewalls although it is understood that the base encapsulation 440 can have other configurations for the sidewalls. For example, the sidewalls of the base encapsulation 440 can be orthogonal and can be perpendicular to the base substrate 430. The encapsulation 402, the integrated circuit die 408, the lead 414, and the base package 428 can form a package-on-package (PoP) device.

It has been discovered that the exposure of the non-active side 412 from the encapsulation 402 provides airflow and cooling for the integrated circuit die 408. The encapsulation cavity 404 provides the non-active side 412 of the integrated circuit die 408 with exposure from the encapsulation 402. The integrated circuit packaging system 400 is thermally enhanced and the integrated circuit die 408 does not require a die paddle that can interfere with cooling. Further, it has been discovered that the configuration of the lead protrusion 424 below the horizontal plane 413 of the non-active side 412 of the integrated circuit die 408 further increases airflow to the integrated circuit die 408.

Further, it has been discovered that the horizontal and vertical dimensions of the encapsulation cavity 404 and the placement of the integrated circuit die 408 in the encapsulation 402 leverages additional space in package-on-package applications. For example, the configuration of the lead protrusion 424 below the horizontal plane 413 of the non-active side 412 provides for variable platform heights that allow different sized base chips and components, such as the base integrated circuit die 434 to fit in the encapsulation cavity 404. Further, the integrated circuit die 408 can share the same substrate as the base package 428 reducing package footprint and profile size. Further, the cavity horizontal dimension 405 provides for different sized components, dies, and packages that can be fitted into the encapsulation cavity 404.

Figure 5:
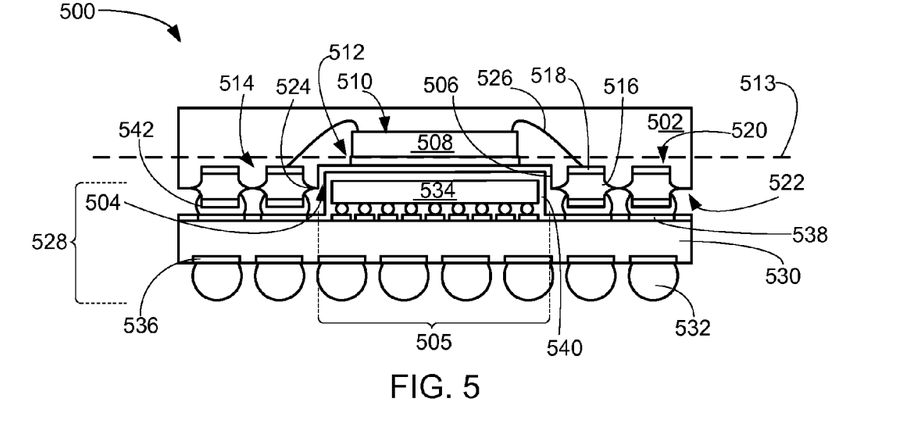
FIG. 5 is a cross-sectional view of the integrated circuit packaging system exemplified by the top view of FIG. 2 taken along line 1-1 of FIG. 2 in a fourth embodiment of the present invention.

Referring now to FIG. 5, therein is shown a cross-sectional view of an integrated circuit packaging system 500 exemplified by the top view of FIG. 2 taken along line 1-1 of FIG. 2 in a fourth embodiment of the present invention. The integrated circuit packaging system 500 can be similar to the integrated circuit packaging system 300 of FIG. 3 except for an additional base package forming a package-on-package system.

The integrated circuit packaging system 500 is shown having an encapsulation 502, an integrated circuit die 508, and a lead 514. The encapsulation 502 covers the integrated circuit die 508 and the lead 514 and provides mechanical protection, environmental protection, and a hermetic seal for the integrated circuit packaging system 500. The encapsulation 502 can include an epoxy molding compound (EMC), film assisted molding, polymide compound, or a wire-in-film (WIF), as examples.

The encapsulation 502 can include an encapsulation cavity 504. The encapsulation cavity 504 can expose the integrated circuit die 508 from the encapsulation 502. The encapsulation cavity 504 can have a cavity horizontal dimension 505, which is defined as the length and the width of the encapsulation cavity 504. The cavity horizontal dimension 505 can be larger than the die horizontal dimension 202 of FIG. 2 of the integrated circuit die 508. For example, the encapsulation cavity 504 can have the cavity horizontal dimension 505 greater than the die horizontal dimensions 202 of FIG. 2 for allowing a longer and wider die to fit into the encapsulation cavity 504.

The encapsulation cavity 504 can also have horizontal dimensions equal to or smaller than the horizontal dimensions of the integrated circuit die 508. The encapsulation cavity 504 can be bounded by a cavity sidewall 506 on a non-horizontal side of the encapsulation 502. The encapsulation cavity 504 can be bounded by the cavity sidewall 506 on a non-horizontal side of the encapsulation 502. The cavity sidewall 506 can be orthogonal and perpendicular to a top surface of the integrated circuit die 508 and can be coplanar with the non-horizontal sidewall of the integrated circuit die 508.

The integrated circuit die 508 is embedded in the encapsulation 502. The integrated circuit die 508 is shown as a wire-bonded chip as an example. The integrated circuit die 508 can have an active side 510 and have a non-active side 512 opposite the active side 510. The non-active side 512 of the integrated circuit die 508 is exposed from the encapsulation 502 at the encapsulation cavity 504. A horizontal plane 513 of the non-active side 512 of the integrated circuit die 508 can extend across the integrated circuit packaging system 500.

The lead 514 can be formed in a number of rows surrounding and spaced from the integrated circuit die 508. As an example, a plurality of the lead 514 is shown in two rows surrounding the encapsulation cavity 504 and the integrated circuit die 508. The lead 514 can include a lead body 516 and a lead plating 518.

The lead body 516 provides the base structure of the lead 514 on which the lead plating 518 can be formed. The lead body 516 can be made from a variety of materials including copper, tin, zinc, other conductive metals, or metal alloy.

The lead plating 518 can be formed on the lead body 516 in a number of ways. For example, the lead plating 518 can be formed by a process such as sputtering, electroplating, or chemical vapor deposition (CVD). The lead plating 518 can be made from metals including gold, silver, nickel, other conductive metal, or a combination thereof as examples.

The lead 514 can include a lead top side 520 and a lead bottom side 522 opposite to the lead top side 520. The lead plating 518 can be formed at the lead top side 520 and the lead bottom side 522 of the lead body 516.

The lead body 516 can include a lead protrusion 524 on a non-horizontal side of the lead body 516. The lead protrusion 524 extends from the lead plating 518 at the lead top side 520 and extends from the lead plating 518 at the lead bottom side 522 to form a tip at the non-horizontal side of the lead body 516. The lead protrusion 524 at the lead bottom side 522 can extend to the encapsulation cavity 504. The lead protrusion 524 is below the horizontal plane 513 at the non-active side 512 of the integrated circuit die 508.

The lead protrusion 524 is shown extending to and exposed at the cavity sidewall 506 of the encapsulation cavity 504. The lead protrusion 524 can also have a portion of the encapsulation 502 between the lead protrusion 524 and the cavity sidewall 506 depending on the horizontal dimensions including the cavity horizontal dimension 505 of the encapsulation cavity 504.

The integrated circuit packaging system 500 can include a chip interconnect 526. The chip interconnect 526 provides an electrical connection and can include a bond wire, a solder ball, or a solder pillar as examples. The chip interconnect 526 can connect the lead plating 518 at the lead top side 520 to the active side 510 of the integrated circuit die 508. The chip interconnect 526 provides electrical connectivity from the lead 514 to the integrated circuit die 508.

The cavity sidewall 506 can have an uneven surface, bulging surface, or an irregular surface characteristic of being formed on a deformable mounting structure. The deformable mounting structure can include a compressed laminated tape, a film, or a thermal release material.

The encapsulation cavity 504 can have removal marks, chemical residue, uneven surfaces, micro recesses characteristic, or a combination thereof characteristic of a destructible removal process. The destructible removal process can include laser ablation and chemical etching.

The lead plating 518 at the lead bottom side 522 can be mounted to a base package 528. The base package 528 can include a base substrate 530, a system interconnect 532, and a base integrated circuit die 534. The base package 528 can include a flip chip base package.

The base substrate 530 can provide structural support and connectivity for other components and devices. The base substrate 530 can include a system contact pad 536 on a top surface of the base substrate 530. The base substrate 530 can include a mount contact pad 538 on a side of the base substrate 530 opposite to the system contact pad 536.

The system interconnect 532 can be attached to the system contact pad 536 on the bottom surface of the base substrate 530 for attaching the base package 528 to the next level system (not shown). The system interconnect 532 can include solder balls, solder dots, solder pillars, or a conductive bump as examples.

A mount interconnect 542 can attach the lead 514 to the base substrate 530. The mount interconnect 542 provides a direct electrical and mechanical connection between the lead 514 and the base substrate 530. The mount interconnect 542 can include solder paste, solder dots, or a conductive bump as examples.

The base integrated circuit die 534 can be mounted to the base substrate 530. The base integrated circuit die 534 is shown as a flip chip although the base integrated circuit die 534 can also be a wire-bonded chip. The base integrated circuit die 534 can be mounted to the base substrate 530 with solder balls, solder dots, or solder pillars for providing an electrically and physical connection between the base integrated circuit die 534 and the base substrate 530.

The base integrated circuit die 534 is shown with a length and width greater than the integrated circuit die 508 although it is understood that the base integrated circuit die 534 can be equal to or smaller than the horizontal dimensions of the integrated circuit die 508. The base integrated circuit die 534 can be positioned into the encapsulation cavity 504 with the cavity horizontal dimension 505 greater than the horizontal dimensions of the integrated circuit die 508. The integrated circuit die 508 can be suspended over the base integrated circuit die 534.

A base encapsulation 540 can cover the base integrated circuit die 534, the base substrate 530, and the area between the base integrated circuit die 534 and the base substrate 530. The base encapsulation 540 can include an epoxy molding compound (EMC), polymide compound, or a wire-in-film (WIF), as examples. The mount contact pad 538 can be exposed from the base encapsulation 540.

The base encapsulation 540 is shown having a length and a width greater than the length and the width of the integrated circuit die 508. The top surface of the base encapsulation 540 can be positioned within the encapsulation cavity 504 with the integrated circuit die 508 suspended over the base encapsulation 540.

The base encapsulation 540 is shown having orthogonal sidewalls although it is understood that the base encapsulation 540 can have other configurations for the sidewalls. For example, the sidewalls of the base encapsulation 540 can be sloped and not perpendicular to the base substrate 530. The encapsulation 502, the integrated circuit die 508, the lead 514, and the base package 528 can form a package-on-package (PoP) device.

It has been discovered that the exposure of the non-active side 512 from the encapsulation 502 provides airflow and cooling for the integrated circuit die 508. The encapsulation cavity 504 provides the non-active side 512 of the integrated circuit die 508 with exposure from the encapsulation 502. The integrated circuit packaging system 500 is thermally enhanced and the integrated circuit die 508 does not require a die paddle that can interfere with cooling. Further, it has been discovered that the configuration of the lead protrusion 524 below the horizontal plane 513 of the non-active side 512 of the integrated circuit die 508 further increases airflow to the integrated circuit die 508.

Further, it has been discovered that the horizontal and vertical dimensions of the encapsulation cavity 504 and the placement of the integrated circuit die 508 in the encapsulation 502 leverages additional space in package-on-package applications. For example, the configuration of the lead protrusion 524 below the horizontal plane 513 of the non-active side 512 provides for variable platform heights that allow different sized base chips and components, such as the base integrated circuit die 534 to fit in the encapsulation cavity 504. Further, the integrated circuit die 508 can share the same substrate as the base package 528 reducing package footprint and profile size. Further, the cavity horizontal dimension 505 provides for different sized components, dies, and packages that can be fitted into the encapsulation cavity 504.

Figure 6:
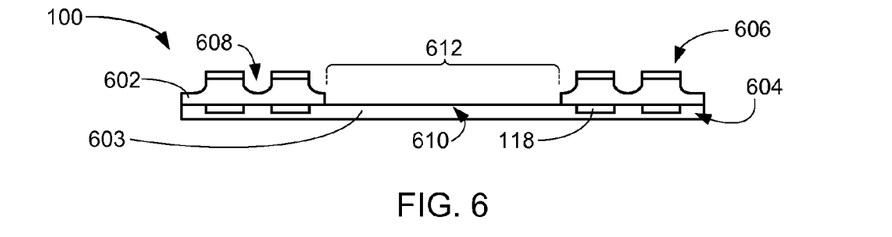
FIG. 6 is a cross-sectional view of the integrated circuit packaging system of FIG. 1 in an application of a lead tape to a leadframe phase of manufacture.

Referring now to FIG. 6, therein is shown a cross-sectional view of the integrated circuit packaging system 100 of FIG. 1 in an application of a lead tape 603 to a leadframe 602 phase of manufacture. The lead tape 603 can be a tape or adhesive epoxy. For example, the lead tape 603 can be a tape that is not damaged by the etching process such as a specially treated polymide tape, a tape with a rigid metal or polymer core, a treated singulation tape, a coverlay tape, or an alkali-resistant tape.

The leadframe 602 can be mounted on the lead tape 603. The leadframe 602 can include a pre-plated leadframe (PPF) having the lead plating 118 at the lead top side 120 of FIG. 1 and the lead bottom side 122 of FIG. 1. The lead plating 118 at the lead bottom side 122 can be in the lead tape 603 and the lead tape 603 can cover a leadframe bottom side 604 of the leadframe 602. The leadframe 602 can include the leadframe bottom side 604 and a leadframe top side 606 opposite to the leadframe bottom side 604.

The leadframe 602 can include a recess 608. The recess 608 can be formed through etching, stamping, or laser ablation, as examples. For example, the leadframe 602 can be etched at the leadframe top side 606 before further processing. Before an etching process, the lead plating 118 can be applied to the leadframe 602. The lead plating 118 acts as an etch mask to resist an etching process at the leadframe top side 606 of the leadframe 602 for etching the leadframe top side 606 of the leadframe 602. The etching process can form the recess 608 in the leadframe 602 between the areas covered by the lead plating 118.

The leadframe 602 can include a mounting region 610 for mounting dies and components on the lead tape 603. The leadframe 602 can include a leadframe hole 612 at the mounting region 610. The leadframe hole 612 can completely passing through the leadframe 602. The leadframe hole 612 can expose the lead tape 603 from the leadframe 602. The leadframe hole 612 can be formed by stamping, etching, or laser ablation as examples.

Figure 7:
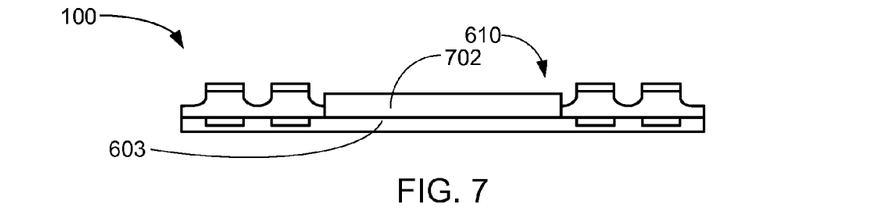
FIG. 7 is the structure of FIG. 6 in the application of a mounting structure phase.

Referring now to FIG. 7, therein is shown the structure of FIG. 6 in the application of a mounting structure 702 phase. The mounting structure 702 can be mounted on the lead tape 603 in the mounting region 610. The mounting structure 702 can have orthogonal sidewalls and the sidewalls of the mounting structure 702 can be in direct contact with the sidewalls of the leadframe 602 of FIG. 6. The mounting structure 702 can have a vertical height extending above the lead protrusion 124 of FIG. 1.

The mounting structure 702 can include a variety of different materials. For example, the mounting structure can be a laminated tape, dry film resist (DFR), thermal release material, or epoxy molding compound as examples. The mounting structure 702 can also be an organic material that is chemically dissolvable such as a dry film resist (DFR).

Figure 8:
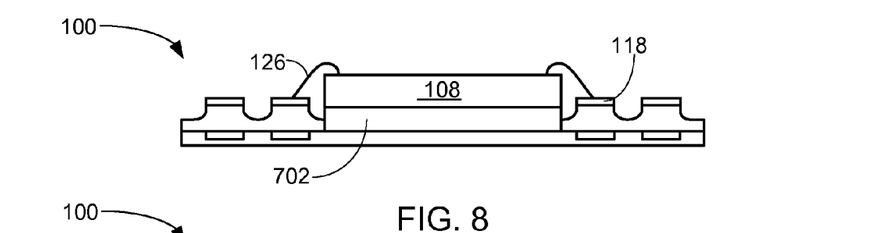
FIG. 8 is the structure of FIG. 7 in a die mounting phase.

Referring now to FIG. 8, therein is shown the structure of FIG. 7 in a die mounting phase. The integrated circuit die 108 can be mounted on the mounting structure 702. The integrated circuit die 108 can have horizontal dimensions equal to, less than, or greater than the horizontal dimensions of the mounting structure 702 as examples. The chip interconnect 126 can be wire-bonded between the integrated circuit die 108 and the lead plating 118 for providing an electrical connection.

Figure 9:
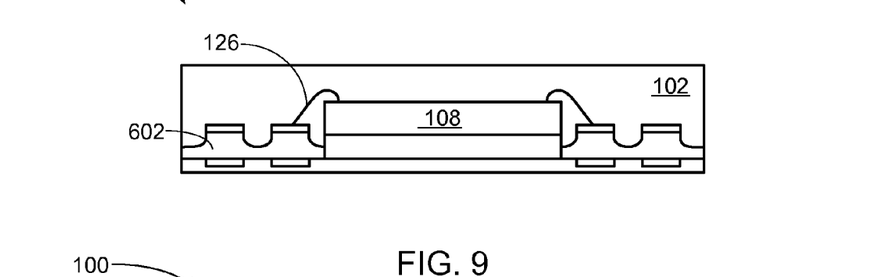
FIG. 9 is the structure of FIG. 8 in a leadframe-encapsulation phase.

Referring now to FIG. 9, therein is shown the structure of FIG. 8 in a leadframe-encapsulation phase. The encapsulation 102 is formed to cover the integrated circuit die 108, the chip interconnect 126, and the leadframe 602. The encapsulation 102 can include an epoxy molding compound (EMC), film assisted molding, polymide compound, or a wire-in-film (WIF) as examples.

Figure 10:
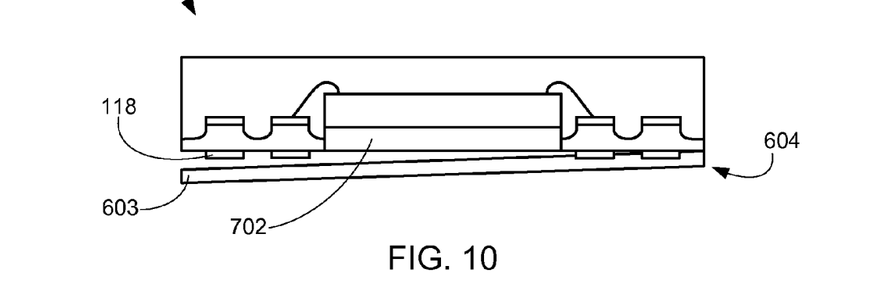
FIG. 10 is the structure of FIG. 9 in a tape-removal phase.

Referring now to FIG. 10, therein is shown the structure of FIG. 9 in a tape-removal phase. The integrated circuit packaging system 100 is shown having all the same components as in FIG. 9 except for the removal of the lead tape 603. The mounting structure 702, the lead plating 118 at the leadframe bottom side 604, and the leadframe bottom side 604 are exposed after the removal of the lead tape 603.

Figure 11:
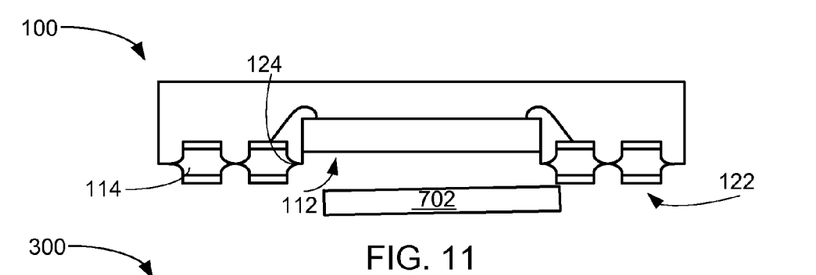
FIG. 11 is the structure of FIG. 10 in a lead-formation phase.

Referring now to FIG. 11, therein is shown the structure of FIG. 10 in a lead-formation phase. The leadframe 602 of FIG. 9 can be further processed for forming a plurality of the lead 114. The leadframe 602 can be processed through various methods including etching, drilling, or cutting as examples.

For example, the leadframe 602 can be etched at the lead bottom side 122 for fully isolating the lead 114 from another of the lead 114. After the lead-formation step, the lead protrusion 124 can be formed between leads. The lead protrusion 124 can be formed from the junction of the curved corners formed by the etching process on the non-horizontal side of the lead 114.

The mounting structure 702 can be removed for exposing the non-active side 112 of the integrated circuit die 108 of FIG. 1 from the encapsulation 102 of FIG. 1. The mounting structure 702 can be removed in a number of ways. For example, the mounting structure 702 can be peeled off if the mounting structure 702 is a laminated tape or film.

If the mounting structure 702 is an organic chemically dissolvable material, the mounting structure 702 can be dissolved away in an etching process. The organic chemically dissolvable material can leave a residue (not shown) on the non-active side 112 which can serve as a die paddle. The mounting structure 702 can also be a thermal release material that can be removed by heating the mounting structure 702.

If the mounting structure 702 is an epoxy molding compound (EMC), the mounting structure 702 can be removed by laser ablation or pullout. After the etching process of the leadframe bottom side 604 of FIG. 10, the mounting structure 702 can be laser ablated. The mounting structure 702 can also be removed by drilling and pull out.

The cavity sidewall 106 of FIG. 1 can have an uneven surface, bulging surface, or an irregular surface characteristic of being formed the mounting structure 702. The mounting structure 702 can be deformable from the compression of the mounting structure 702 by the integrated circuit die 108 of FIG. 1.

The encapsulation cavity 104 of FIG. 1 can have removal marks, chemical residue, uneven surfaces, micro recesses characteristic, or a combination thereof characteristic of a destructible removal process. The destructible removal process can include laser ablation and chemical etching of the mounting structure 702 if the mounting structure 702 is EMC or the organic chemically dissolvable material.

It has been discovered that the mounting structure 702 can provide a variable platform height for the integrated circuit die 108 during the encapsulation process. The height of the mounting structure 702 can be adjusted to determine the height of the encapsulation cavity 104 of FIG. 1. Different sized components, dies, and packages can be fitting into the encapsulation cavity 104 after the removal of the mounting structure 702. Overall package thickness is reduced as the encapsulation cavity 104 saves space for base packages.

Further, it has been discover that the mounting structure 702 and the encapsulation cavity 104 can provide for variable lengths and widths of components, dies, and packages mounted to the lead 114. For example, the mounting structure 702 and the encapsulation cavity 104 can be customized to fit base dies that can have horizontal dimensions equal to or greater than the horizontal dimensions of the integrated circuit die 108.

Figure 12:
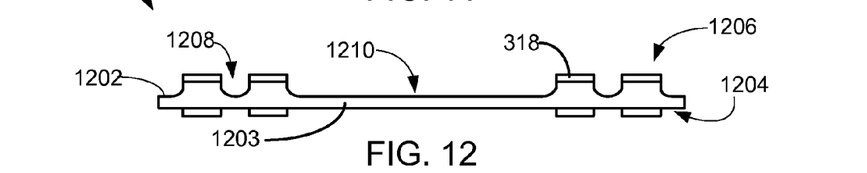
FIG. 12 is cross-sectional view of the integrated circuit packaging system of FIG. 3 in a leadframe providing phase of manufacture.

Referring now to FIG. 12, therein is shown a cross-sectional view of the integrated circuit packaging system 300 of FIG. 3 in a leadframe 1202 providing phase of manufacture. The leadframe 1202 can include a leadframe bottom side 1204 and a leadframe top side 1206 opposite to the leadframe bottom side 1204. The leadframe 1202 can include a pre-plated leadframe (PPF) having the lead plating 318 at the leadframe bottom side 1204 and the leadframe top side 1206.

The leadframe 1202 can include a recess 1208. The recess 1208 can be formed through etching, stamping, or laser ablation, as examples. For example, the leadframe 1202 can be etched at the leadframe top side 1206 before further processing. Before an etching process, the lead plating 318 can be applied to the leadframe 1202. The lead plating 318 acts as an etch mask to resist an etching process at the leadframe top side 1206 of the leadframe 1202 for etching the top surface of the leadframe 1202. The etching process can form the recess 1208 in the leadframe 1202 between the areas covered by the lead plating 318.

The leadframe 1202 can include a mounting region 1210 for mounting dies and components on the leadframe 1202. The mounting region 1210 can include a thin leadframe layer 1203 as a contour in the leadframe 1202 that does not completely pass through the leadframe 1202. The mounting region 1210 can be formed by stamping, etching, or laser ablation as examples.

Figure 13:
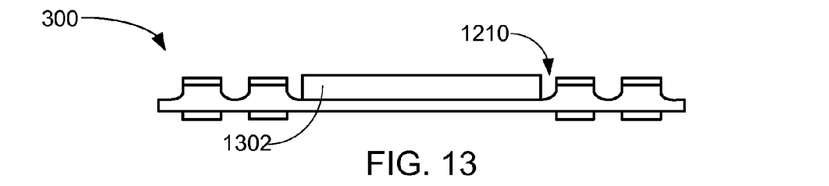
FIG. 13 is the structure of FIG. 12 in the application of a mounting structure phase.

Referring now to FIG. 13, therein is shown the structure of FIG. 12 in the application of a mounting structure 1302 phase. The mounting structure 1302 can be mounted directly on the thin leadframe layer 1203 of FIG. 12 at the mounting region 1210. The mounting structure 1302 can have orthogonal sidewalls. The bottom surface of the mounting structure 1302 can be above the lead protrusion 324 of FIG. 3.

The mounting structure 1302 can include a variety of different materials. For example, the mounting structure can be a laminated tape, film, thermal release material, or epoxy molding compound. The mounting structure 1302 can also be an organic material that is chemically dissolvable such as a dry film resist (DFR).

Figure 14:
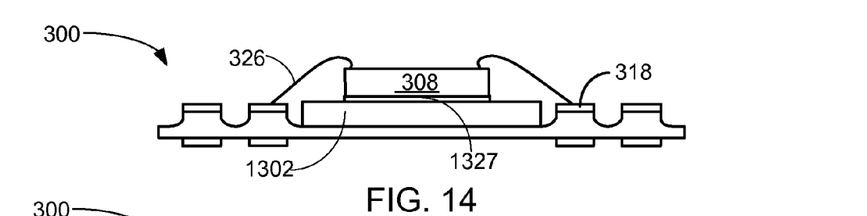
FIG. 14 is the structure of FIG. 13 in a die mounting phase.

Referring now to FIG. 14, therein is shown the structure of FIG. 13 in a die mounting phase. The integrated circuit die 308 can be mounted on the mounting structure 702 using a die adhesive 1327. The integrated circuit die 308 can have horizontal dimensions equal to or less than the horizontal dimensions of the mounting structure 1302. The chip interconnect 326 can be wire-bonded between the integrated circuit die 308 and the lead plating 318 for providing an electrical connection.

Figure 15:
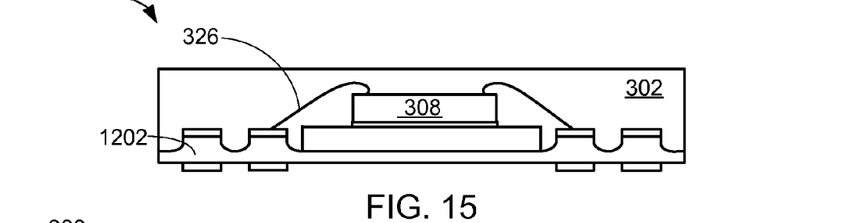
FIG. 15 is the structure of FIG. 14 in a leadframe-encapsulation phase.

Referring now to FIG. 15, therein is shown the structure of FIG. 14 in a leadframe-encapsulation phase. The encapsulation 302 is formed to cover the integrated circuit die 308, the chip interconnect 326, and the leadframe 1202. The encapsulation 302 can include an epoxy molding compound (EMC), film assisted molding, polymide compound, or a wire-in-film (WIF).

Figure 16:
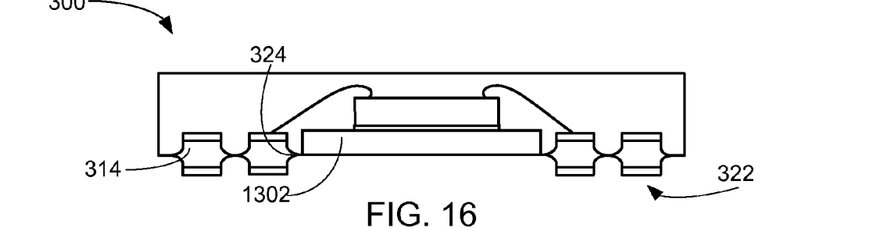
FIG. 16 is the structure of FIG. 15 in a lead-formation phase.

Referring now to FIG. 16, therein is shown the structure of FIG. 15 in a lead-formation phase. The leadframe 1202 of FIG. 15 can be further processed for forming a plurality of the lead 314 and for removing the thin leadframe layer 1203 of FIG. 12 of the leadframe 1202. The leadframe 1202 can be processed through various methods including etching, drilling, or cutting as examples.

For example, the leadframe 1202 can be etched at the lead bottom side 322 for fully isolating the lead 314 from another of the lead 314. After the lead-formation step, the lead protrusion 324 can be formed between leads. The lead protrusion 324 can be formed from the junction of the curved corners formed by the etching process on the non-horizontal side of the lead 314. The leadframe 1202 can also be etched to remove the thin leadframe layer 1203 at the mounting region 1210 of FIG. 2 of the leadframe 1202 for exposing the mounting structure 1302.

Figure 17:
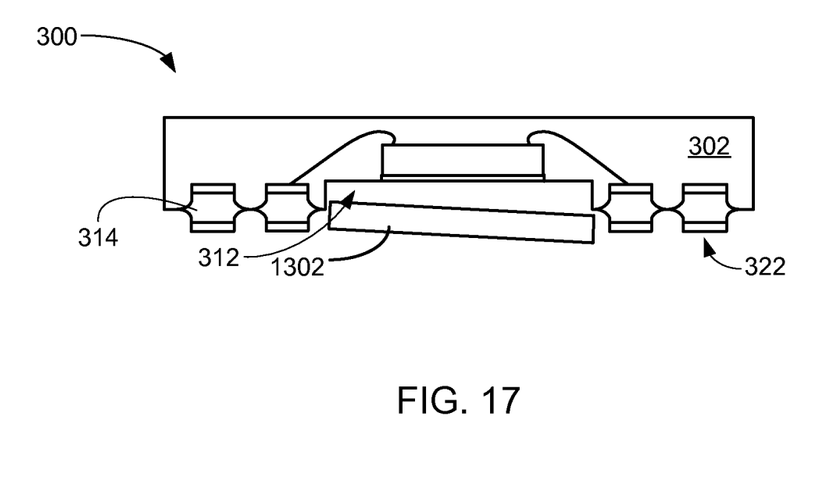
FIG. 17 is the structure of FIG. 16 in a removal of the mounting structure phase.

Referring now to FIG. 17, therein is shown the structure of FIG. 16 in a removal of the mounting structure 1302 phase. The mounting structure 1302 can be removed for exposing the non-active side 312 of the integrated circuit die 308 of FIG. 3 from the encapsulation 302. The mounting structure 1302 can be removed in a number of ways. For example, the mounting structure 1302 can be peeled off if the mounting structure 1302 is a laminated tape or film.

If the mounting structure 1302 is an organic chemically dissolvable material, the mounting structure 1302 can be dissolved away in an etching process. The organic chemically dissolvable material can leave a residue on the non-active side 312 which can serve as a die paddle. The mounting structure 1302 can also be a thermal release material that can be removed by heating the mounting structure 1302.

If the mounting structure 1302 is an epoxy molding compound (EMC), the mounting structure 1302 can be removed by laser ablation or pullout. After the etching process at the lead bottom side 322, the mounting structure 1302 can be laser ablated. The mounting structure 1302 can also be removed by drilling or pull out.

The cavity sidewall 306 of FIG. 3 can have an uneven surface, bulging surface, or an irregular surface characteristic of being formed the mounting structure 1302. The mounting structure 1302 can be deformable from the compression of the mounting structure 1302 by the integrated circuit die 308 of FIG. 3.

The encapsulation cavity 304 of FIG. 3 can have removal marks, chemical residue, uneven surfaces, micro recesses characteristic, or a combination thereof characteristic of a destructible removal process. The destructible removal process can include laser ablation and chemical etching of the mounting structure 1302 if the mounting structure 1302 is EMC or the organic chemically dissolvable material.

It has been discovered that the mounting structure 1302 can provide a variable platform height for the integrated circuit die 308 of FIG. 3 during the encapsulation process. The height of the mounting structure 1302 can be adjusted to determine the height of the encapsulation cavity 304. Different sized components, dies, and packages can be fitting into the encapsulation cavity 304 after the removal of the mounting structure 1302. Overall package thickness is reduced as the encapsulation cavity 304 saves space for base packages.

Further, it has been discover that the mounting structure 1302 and the encapsulation cavity 304 can provide for variable lengths and widths of components, dies, and packages mounted to the lead 314. For example, the mounting structure 1302 and the encapsulation cavity 304 of FIG. 3 can be customized to fit base dies that can have horizontal dimensions equal to or greater than the horizontal dimensions of the integrated circuit die 308.

Figure 18:
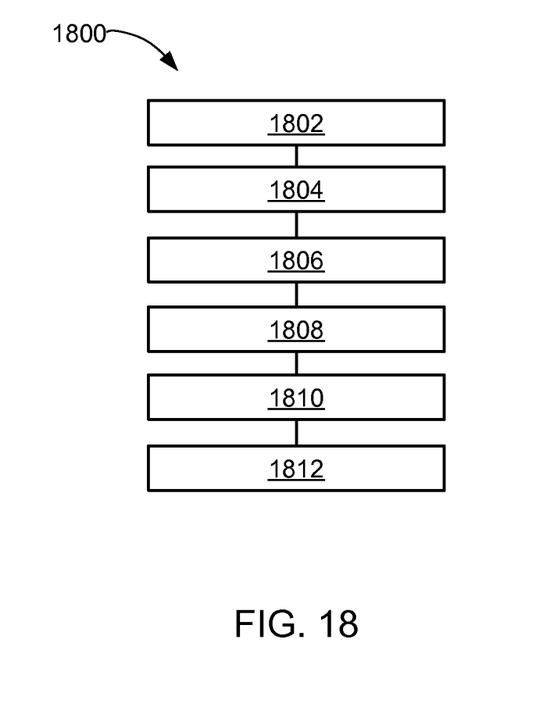
FIG. 18 is a flow chart of a method of manufacture of the integrated circuit packaging system in a further embodiment of the present invention.

Referring now to FIG. 18, therein is shown a flow chart of a method 1800 of manufacture of the integrated circuit packaging system in a further embodiment of the present invention. The method 1800 includes providing a leadframe having a mounting region in a block 1802; applying a mounting structure in the mounting region in a block 1804; mounting an integrated circuit die on the mounting structure in a block 1806; forming an encapsulation on the integrated circuit die and having an encapsulation cavity, the encapsulation cavity shaped by the mounting structure in a block 1808; forming a lead having a lead protrusion from the leadframe, the lead protrusion below a horizontal plane of the integrated circuit die in a block 1810; and removing the mounting structure for exposing the integrated circuit die in a block 1812.

Thus, it has been discovered that the integrated circuit packaging system of the present invention furnishes important and heretofore unknown and unavailable solutions, capabilities, and functional aspects for mold interlock. The resulting method, process, apparatus, device, product, and/or system is straightforward, cost-effective, uncomplicated, highly versatile and effective, can be surprisingly and non-obviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of an integrated circuit packaging system comprising:
   providing a leadframe having a mounting region;
   applying a mounting structure in the mounting region;
   mounting an integrated circuit die on the mounting structure;
   forming an encapsulation on the integrated circuit die and having an encapsulation cavity, the encapsulation cavity shaped by the mounting structure;
   forming a lead having a lead protrusion from the leadframe, the lead protrusion below a horizontal plane of a bottom of the integrated circuit die; and
   completely removing the mounting structure for exposing the bottom of the integrated circuit die.

2. The method as claimed in claim 1 wherein forming the encapsulation includes forming the encapsulation cavity having a cavity horizontal dimension larger than a die horizontal dimension of the integrated circuit die.

3. The method as claimed in claim 1 wherein forming the encapsulation includes forming the encapsulation cavity having the lead protrusion extend to the encapsulation cavity.

4. The method as claimed in claim 1 further comprising:
   providing a base substrate;
   mounting a base integrated circuit to the base substrate; and
   mounting the base substrate to the lead with the base integrated circuit in the encapsulation cavity and the integrated circuit die over the base integrated circuit.

5. The method as claimed in claim 1 wherein:
   providing the leadframe includes providing the leadframe having a leadframe hole at the mounting region; and
   further comprising:
   applying a lead tape to a leadframe bottom side of the leadframe; and
   removing the lead tape for exposing the mounting structure.

6. A method of manufacture of an integrated circuit packaging system comprising:
   providing a leadframe having a mounting region and plating a lead;
   applying a mounting structure in the mounting region;
   mounting an integrated circuit die on the mounting structure;
   forming an encapsulation on the integrated circuit die and having an encapsulation cavity, the encapsulation cavity shaped by the mounting structure;
   forming the lead having a lead protrusion from the leadframe, the lead protrusion below a horizontal plane of a bottom of the integrated circuit die; and
   completely removing the mounting structure for exposing the bottom of the integrated circuit die.

7. The method as claimed in claim 6 wherein forming the lead includes forming the lead partially in the encapsulation with only a portion of the lead at a lead bottom side exposed from the encapsulation.

8. The method as claimed in claim 6 wherein forming the encapsulation includes forming the encapsulation cavity bounded by a cavity sidewall, the cavity sidewall is orthogonal to the horizontal plane of the integrated circuit die.

9. The method as claimed in claim 6 further comprising connecting a chip interconnect between the integrated circuit die and the lead.

10. The method as claimed in claim 6 wherein:
    providing the leadframe includes providing a thin leadframe layer for mounting the mounting structure thereon; and
    further comprising:
    removing the thin leadframe layer with an etching process.

* * * * *